(12) United States Patent
Large et al.

(10) Patent No.: US 8,330,159 B2
(45) Date of Patent: Dec. 11, 2012

(54) MASK DESIGN ELEMENTS TO AID CIRCUIT EDITING AND MASK REDESIGN

(75) Inventors: Jeffrey Lee Large, Dallas, TX (US); Henry Litzmann Edwards, Garland, TX (US); Ayman A. Fayed, Wylie, TX (US); Patrick Cruise, Dallas, TX (US); Kah Mun Low, Richardson, TX (US); Neeraj Nayak, Richardson, TX (US); Oguz Altun, Plano, TX (US); Chris Barr, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 717 days.

(21) Appl. No.: 11/933,841

(22) Filed: Nov. 1, 2007

(65) Prior Publication Data

US 2009/0114912 A1 May 7, 2009

(51) Int. Cl.
  *H01L 23/58* (2006.01)
  *H01L 23/48* (2006.01)
(52) U.S. Cl. .................. 257/48; 257/758; 257/773
(58) Field of Classification Search .............. 257/48, 257/211, 758, 773, 798, E21.526, E21.577, 257/E23.002, E23.151, 774, 775; 258/E23.002
See application file for complete search history.

(56) References Cited

U.S. PATENT DOCUMENTS

| | | | |
|---|---|---|---|
| 5,640,049 A * | 6/1997 | Rostoker et al. | 257/758 |
| 6,211,527 B1 | 4/2001 | Chandler | |
| 6,265,778 B1 * | 7/2001 | Tottori | 257/758 |
| 6,680,484 B1 | 1/2004 | Young | |
| 6,911,832 B2 | 6/2005 | Kolachina et al. | |
| 7,056,752 B2 | 6/2006 | Whetsel et al. | |
| 7,087,927 B1 * | 8/2006 | Weaver et al. | 257/48 |
| 7,117,476 B2 | 10/2006 | Bach et al. | |
| 7,205,566 B2 | 4/2007 | Livengood et al. | |
| 2008/0203388 A1 * | 8/2008 | He et al. | 257/48 |

* cited by examiner

*Primary Examiner* — Hung Vu
(74) *Attorney, Agent, or Firm* — Frederick J. Telecky, Jr.; Michael A. Davis, Jr.; Warren L. Franz

(57) ABSTRACT

An integrated circuit (IC) includes a substrate having a device layer and a plurality of metal layers formed thereon. The plurality of metal layers include patterned upper metal layers and lower metal layers, a multi-level metal interconnect structure formed using the plurality of metal layers, where the interconnect structure is in electrical contact with a first portion and second portion of the device layer. At least one circuit editing structure including a first and second columns are formed using at least a portion of the plurality of metal layers, the first column being in electrical contact with the first portion of the device layer and the second column being in electrical contact with second portion of the device layer, where a portion of the first and second columns define a circuit editing feature operable to electrically couple or decouple the columns using focused ion beam (FIB) processing.

10 Claims, 11 Drawing Sheets

MASK DESIGN ELEMENTS TO AID CIRCUIT EDITING AND MASK REDESIGN

FIELD OF THE INVENTION

The present invention relates generally to integrated circuit design, and more particularly, to integrated circuit designs including structures adapted for rapid redesign.

BACKGROUND

Integrated circuits are fabricated by growing, depositing, diffusing, and etching thin layers of conductors, insulators, and semiconductors onto a substrate having a semiconductor layer, such as silicon. To keep the fabrication processes operating properly, or to diagnose and correct the process when a defect does occur, process engineers must be able to quickly examine the various processed layers.

A primary tool used for examining, analyzing, and repairing processing layers is a focused ion beam (FIB) system. FIB systems improve manufacturing yields by identifying and analyzing defects on in-process wafers, allowing the source of defects to be located and corrected. For example, layers can be sputter-etched by a FIB system to expose underlying layers for observation and testing, or cross sections can be cut to expose the edges of multiple layers to observe layer thickness, uniformity, and inclusions.

FIB systems are also useful in the design or prototyping stages of integrated circuit designs. When a prototype integrated circuit is fabricated and tested, it is often found that changes to the circuit design are necessary. A FIB system can modify an integrated circuit, allowing changes to be rapidly implemented and tested without having to modify the photolithography masks and re-run the manufacturing process to create a new prototype. Such changes are called "device edits." For example, a FIB system can be used to sever electrical connections by etching through conductors or to create new connections by the selective deposition of conductive materials. The design changes made using FIB device edits can be verified by subsequent electrical testing and incorporated into a final mask design to be used for mass production of the integrated circuit.

During the device edits, it may be necessary to create electrical connections between buried connectors. This can be done by FIB milling holes, or "vias", through the insulating layers above a conductor to expose the underlying conductor. When the underlying conductors are deeply buried, however, the material sputtered at the bottom of the hole during milling tends to redeposit on the side walls of the hole. Thus, it becomes difficult to mill a hole having a high aspect ratio, that is, a hole much deeper than it is wide or long. Accordingly, as the number of metal conductive layers in a device increases, the more difficult the FIB milling process becomes. Unfortunately, with the dense packing of modern integrated circuits, a wide hole may damage or expose circuitry in other layers, including the conductive metal layers of the interconnect structure. Such damage or exposure can result in shorts or opens in these metal layers. However, damage is not limited to the conductive layers of the interconnect structure. The dielectric materials of the interconnect structure can be damaged as well during the FIB milling process. Although any dielectric material is generally susceptible to FIB damage, in low density dielectric materials, such as low-k dielectrics, the amount of damage can increase significantly and can undesirably raise the dielectric constant.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

In a first embodiment of the invention, an integrated circuit (IC) can include a substrate having at least one device layer and a plurality of metal layers formed thereon, the plurality of metal layers comprising one or more patterned upper metal layers and one or more patterned lower metal layers. A multi-level metal interconnect structure is formed using the plurality of metal layers, where the interconnect structure is in electrical contact with a first portion and at least a second portion of the device layer. At least one circuit editing structure comprising a first and at least a second column is formed using at least a portion of the plurality of metal layers, where the first column is in electrical contact with the first portion of the device layer and the second column is in electrical contact with the second portion of the device layer. At least a portion of the first and second columns defines a circuit editing feature operable to electrically couple or electrically decouple the columns using FIB processing.

In a second embodiment of the invention, a mask set for manufacturing an integrated circuit (IC) on a substrate can include a plurality of features for forming at least one device layer, a multi-level metal interconnect structure and a plurality of metal layers. The plurality of metal layers comprise one or more patterned upper metal layers and one or more patterned lower metal layers, where the interconnect structure is in electrical contact with a first portion and at least a second portion of the device layer. At least one circuit editing structure comprises a first and at least a second column formed using at least a portion of the plurality of metal layers, where the first column is in electrical contact with the first portion of the device layer and the second column is in electrical contact with the second portion of the device layer. At least a portion of the first and second columns defines a circuit editing feature operable to electrically couple or electrically decouple the columns using FIB processing.

In a third embodiment of the invention, a method of prototyping an integrated circuit (IC) is disclosed, where the IC comprises a plurality of metal layers and at least one circuit editing structure. The circuit editing structure comprises a first and at least a second column formed using at least a portion of the plurality of metal layers, where the first column is in electrical contact with the first portion of a device layer and the second column is in electrical contact with the second portion of the device layer, and where at least a portion of the first and second columns defines a circuit editing feature operable to electrically couple or electrically decouple the columns using FIB processing. Data is evaluated from at least one electrical parameter for the IC while the IC is in an initial circuit arrangement, the circuit editing structure is modified using the FIB processing to select a second circuit arrangement for the IC, data is re-evaluated from the electrical parameter for the IC while in the second circuit arrangement, and a final circuit arrangement is established based on the data.

DETAILED DESCRIPTION OF THE INVENTION

Figure 1A:
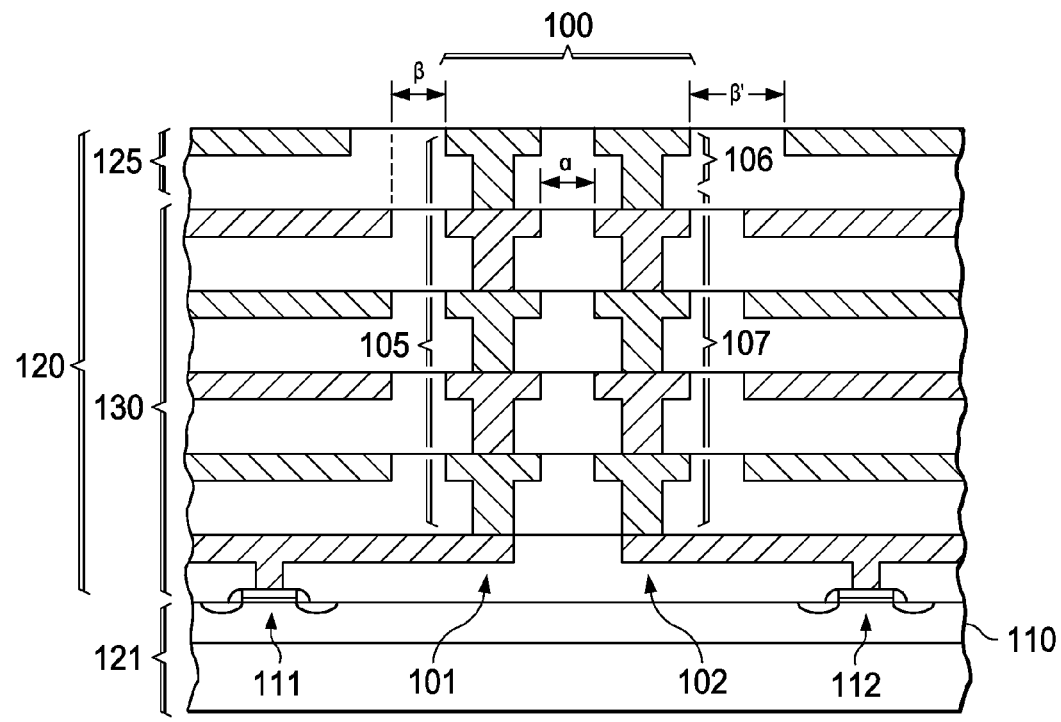
FIG. 1A shows an exemplary circuit editing structure according to an embodiment of the present invention.

Exemplary embodiments of the present invention are described with reference to the attached figures, wherein like reference numerals are used throughout the figures to designate similar or equivalent elements. The figures are not drawn to scale and they are provided merely for illustrative purposes. Several aspects of the invention are described below with reference to example applications for illustration. It should be understood that the numerous specific details, relationships, and methods set forth below are provided for a full understanding of the exemplary embodiments of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the various embodiments of present invention.

The embodiments of the present invention are generally directed toward a circuit editing structure formed over a substrate having a semiconductor layer thereon. In at least one embodiment, the circuit editing structure is included within a mask set for forming the integrated circuit. The circuit editing structure can be formed using at least a portion of the plurality of metal layers in the integrated circuit. Providing such structures in an integrated circuit has been found by the present inventors to provide easier access to portions of the integrated circuit to be modified, as well as reducing damage resulting from FIB processing.

Furthermore, when such structures are located in the upper metal layers of the integrated circuit comprising a multi-layer metal interconnect structure, costs associated with mask redesign and production can be reduced, as changes in the masks and process flow can be limited to only the upper metal layers of the integrated circuit. Additionally, the number of in-process wafers that need to be scrapped, and therefore amount of integrated circuit product lost, can be reduced, as wafers already undergoing processing can be modified using the FIB editing structures, or by applying a modified mask to wafers not yet processed. Also, by limiting the changes to upper levels of the integrated circuit, cycle time can be reduced, as the potential number of processes being affected by changes can be minimized. Moreover, by limiting the changes to upper levels of the integrated circuit, the circuit yield of the processed wafers can be increased, as the number of operations that need to be modified is minimized and the processes and masks for lower levels, typically more sensitive to modifications, can be left unaltered.

According to an embodiment of the invention, a FIB edit process can include etching and deposition processes. As known in the art, FIB provides the ability to deposit and etch electrically insulating, semiconductor, and electrically conducting materials. Materials and processes for deposition and etch using FIB processing well known in the art. However, the invention is not limited to FIB processing, and other device editing techniques for integrated circuits are within the scope of the invention.

According to one exemplary embodiment of the present invention, as illustrated in a cross section view of the interconnect structure of an integrated circuit in FIG. 1A, an exemplary circuit edit structure 100 comprises a plurality of patterned electrically conductive metal layers 105 formed over the substrate 121. The plurality of layers 105 form two electrically conductive columns 101, 102 connected to at least two portions 111, 112 of the device layer 110 of the integrated circuit. Although only two columns are illustrated in FIG. 1A, it is within the scope of the invention to include more than two columns in the circuit editing structure. Additionally, even though FIG. 1 shows vertical columns 101, 102, it is also within the scope of the invention to form a circuit editing structure comprising columns traveling in other than straight vertical paths. For example, each column can comprise one or more portions traveling in multiple vertical and horizontal directions. Furthermore, the columns 101, 102 need not be identical or symmetric.

In the circuit editing structure shown in FIG. 1A, the columns 101, 102 comprise pluralities of electrically conductive trench and via portions, wherein the pluralities of trench and via portions are generally arranged in neighboring and electrically isolated vertical columns. In one embodiment, the trench and via portions can be formed using a full via-first dual damascene metal (e.g. copper) metallization process flow. The invention can be used in connection with other processes and process flows, such as trench-first dual damascene or single damascene processes. Furthermore, the invention can also be used with other metallization process flows, including non-damascene process flows, such as for aluminum metallization comprising processes. The plurality of metal layers 105 may be comprised of a variety of metals, including but not limited to aluminum, copper, and alloys thereof. The metal layers in the interconnect structure and the circuit editing structure can be formed in one or more insulating layers, such as silicon dioxide, phosphosilicate glass (PSG), boro-phosphosilicate glass (BPSG), low-k dielectric materials, or other insulating material formed over the device layer 110 to electrically insulate each of the metal layers 105.

As previously described, each of the columns 101, 102 can be used to contact at least two portions 111, 112 of the device layer of the integrated circuit. In the exemplary embodiment illustrated in FIG. 1A, the device layer portions 111, 112 comprise two separate devices formed in the device layer 110. These devices are indirectly contacted by the columns 101, 102 via a lower layer of metal of the neighboring interconnect structure 120. However in some embodiments the columns 101, 102 can directly contact the device layer portions 111, 112.

Furthermore, although not shown in FIG. 1A, the columns 101, 102 can connect to portions of the device layer 110 through different metal layers of the integrated circuit. For example, a first column can be configured to connect to a portion of the device layer 110 through a first metal layer and a second column can be configured to connect to the second portion through a second metal layer different from the first layer. In another example, a first column can be configured to contact the first device 111 directly and a second column can be configured to contact the second device indirectly through the interconnect structure 120. Additionally, devices 111, 112 and points of contact in the interconnect structure 120 need not be proximate to each other. Furthermore, although FIG. 1A shows the columns 101, 102 contacting only the gates of devices 111, 112, the columns can directly or indirectly contact any feature in the device layer 110.

The metal layers of the circuit editing structure 100 are shown to coincide with the metal layers of the interconnect structure 120. However, the circuit editing structure 100 can be formed using only a portion of the metal layers used to form the interconnect structure 120. In such embodiments, a circuit design rule can require that no portion of the interconnect structure 120 be formed in the regions of the integrated circuit directly above the circuit editing structure 100.

To maintain electrical isolation between the columns 101, 102, adjacent portions of the circuit editing structure 100 can be spaced at a minimum column-to-column spacing ($\alpha$). Using this minimum column spacing the circuit editing structure 100 can minimize the amount of area occupied by the circuit editing structure 100 in the integrated circuit. The minimum column spacing, however, need not be the same for each layer of metal and can vary according to the level of metal. Such a variation in spacing, one of ordinary skill in the art would recognize, may be necessary for different technologies and process flows for forming the interconnect structure 120 and the circuit editing structure 100. Furthermore, in order to maintain electrical isolation between a portion of the circuit editing structure 100 and an adjacent portion of the interconnect structure 120, a minimum column-to-interconnect spacing ($\beta$) can also be based on a minimum design rule spacing. Similar to column-to-column spacing, the minimum column-to-interconnect spacing ($\beta$) can also vary according the level of metal.

In the various embodiments of the invention, at least a portion of the columns 101, 102 can be placed within a FIB proximity of each other. As used herein, "FIB proximity" is defined as columns 101, 102 being be placed in sufficient physical proximity to each other such that a FIB process can be used to modify the columns during a FIB process without having to significantly reposition the substrate during the FIB process. For example, certain types of FIB edits can require a minimum shift in position, typically around 100 nm. Nonetheless, any portions of the columns 101, 102 in FIB proximity can therefore define one or more circuit editing features. Although the necessary proximity in a circuit editing feature can vary according to the process being used, in at least one embodiment the minimum spacing between columns 101, 102 can be as low as 100 nm. In other embodiments, FIB processing conditions can require that this minimum spacing be increased as the aspect ratio for the hole required to the editing feature is increased.

In at least some embodiments, it may be necessary to take into consideration the FIB process variation in determining the minimum column-to-interconnect spacing. For example, as shown in FIG. 1A, the minimum column-to-interconnect spacing ($\beta'$) between the top metal layer 106 of the circuit editing structure 100 and the top metal level 125 of the interconnect structure 120 (the top level 125) can be greater than for the lower metal levels 107 of the circuit editing structure 100 ($\beta'>\beta$). Such a larger column to interconnect spacing can be based on FIB milling characteristics and can be used to ensure that process variations in forming a hole during the FIB milling process do not inadvertently expose the metal layers of the nearby interconnect structure 120. For example, the minimum spacing between the top metal level 106 of the FIB structure 100 and the top metal layer 125 of the interconnect structure 120 can be twice the normal spacing ($\beta'=2\beta$). However, depending on the FIB process parameters, this minimum spacing can be increased or decreased to further reduce the amount of area required for the circuit editing structure 100 on an integrated circuit.

Accordingly, the minimum column spacing ($\alpha$) and the minimum column-to-interconnect spacing ($\beta$, $\beta'$, ...) can be implemented in a circuit design tool including error checking to ensure that integrated circuit designs including circuit editing structures adhere to the limitations of the FIB processes. Although, the circuit editing structures can be manually placed in the circuit design, in some embodiments, the circuit editing structures can be automatically placed or can be included in certain types of component designs or as part of certain components. The resulting integrated circuit design can then be used to create photolithography masks for use in a semiconductor manufacturing process. Using such masks, an integrated circuit having circuit editing structures, such as the circuit editing structure 100 shown in FIG. 1A, can be formed.

Subsequent testing of the integrated circuit including circuit editing structure 100 may determine that the portions of the device layer 111, 112 contacted by the columns 101, 102 of the circuit editing structure need to be connected to debug or repair the integrated circuit. The placement and formation of circuit editing structure 100 provides an easily accessible structure that can be used to connect lower portions of the integrated circuit using an upper metal layer, rather than having to perform FIB milling through multiple layers of the integrated circuit to reach lower layers of the integrated circuit, such as the device layer portions 111, 112, and possibly damaging the integrated circuit.

Figure 1B:
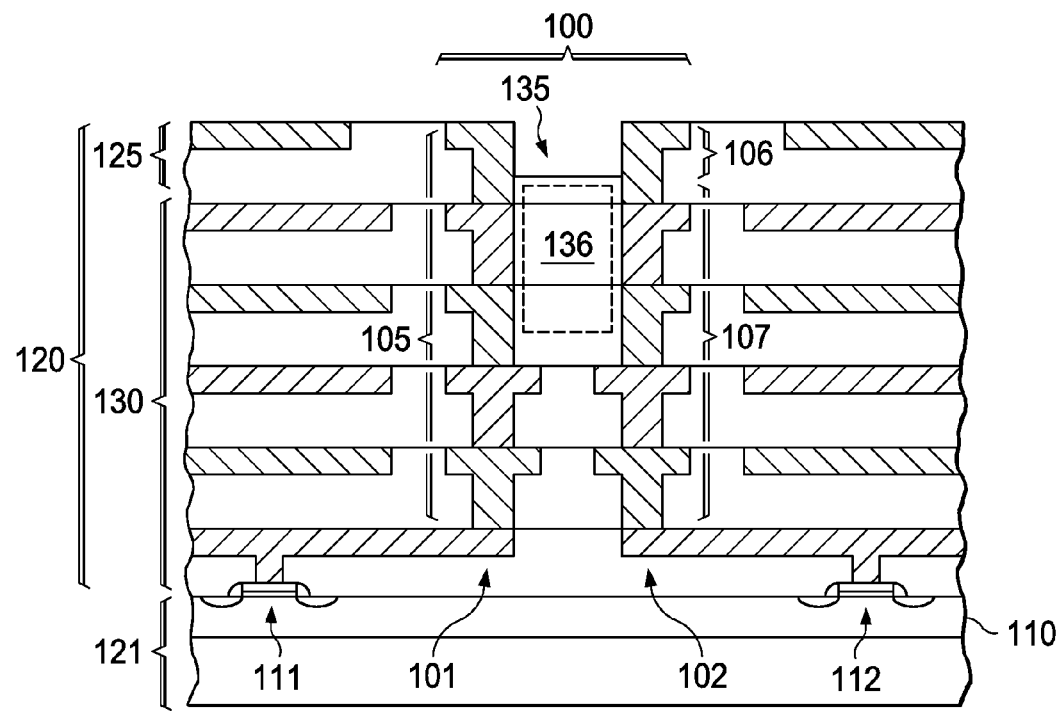
FIGS. 1B and 1C show exemplary processing of the circuit editing structure in FIG. 1A, according to an embodiment of the present invention.
Figure 1C:
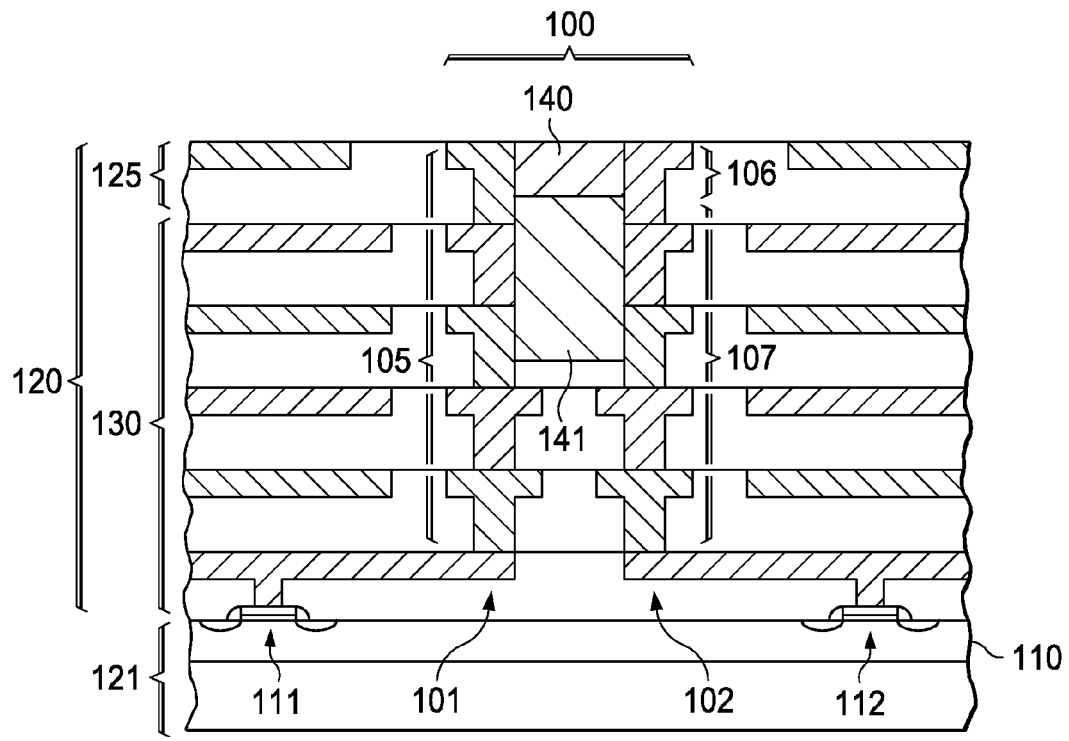

As shown in FIG. 1B, during a FIB circuit edit, FIB milling processes can be used to expose at least a portion of the top metal layer 106 of the circuit editing structure 100 and to remove at least a portion of the dielectric material to form an open region 135 located in between. A FIB "strap" 140, i.e., an electrically conducting member, can then be deposited using a FIB metal deposition process, as shown in FIG. 1C. Consequently, the columns 101, 102 of the circuit editing structure 100 become connected through the strap 140, connecting the device layer portions 111, 112. Subsequently, the integrated circuit can be further tested to determine if additional FIB edits are needed.

The increased path length, due to the size of circuit editing structure 100, can increase the electrical resistance between the device layer portions 111, 112. Therefore, if increased electrical resistance can result in significantly degraded integrated circuit performance, prior to the deposition of the FIB strap 140, additional dielectric material can be removed in region 136 between at least some of the lower layers 107 of the circuit editing structure 100, as shown in FIG. 1B. This region 136 can also be filled with metal to form an additional FIB strap 141 using a FIB process, as shown in FIG. 1C. The additional FIB strap 141 provides a lower resistance connection between the columns 101, 102 and consequently between the device layer portions 111, 112. Afterwards, if no further device edits are required, the mask design for the modified metal layers of the integrated circuit can be adjusted to reflect the changes in the integrated circuit made using FIB processing.

Figure 2A:
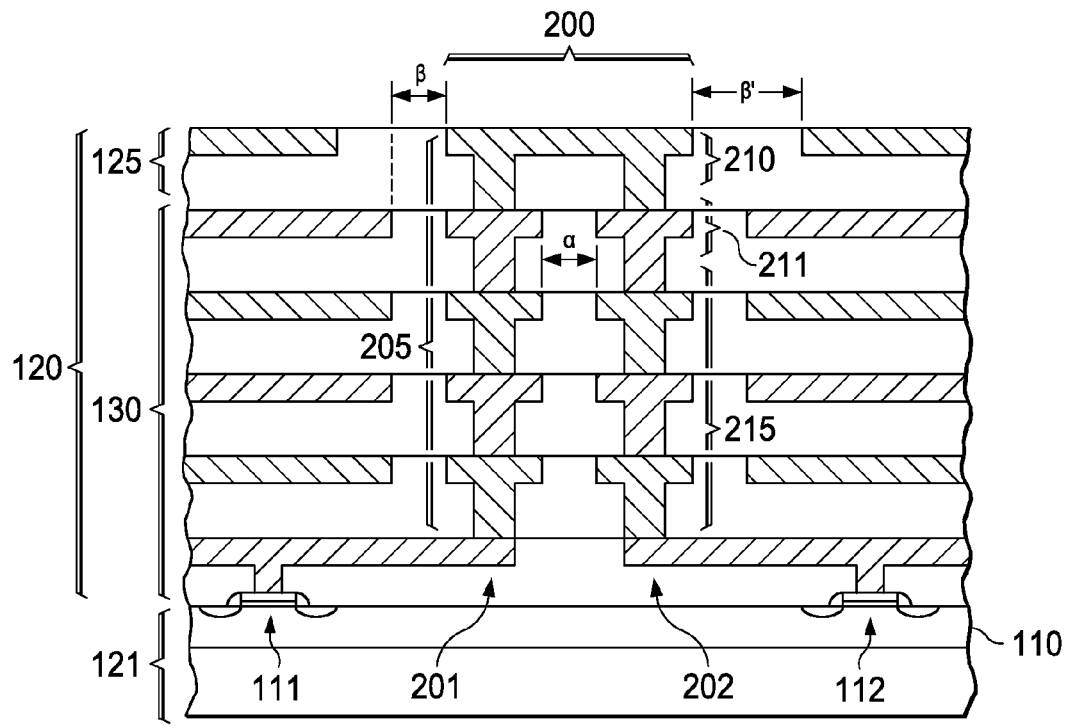
FIG. 2A shows an exemplary circuit editing structure according to an embodiment of the present invention.

The various embodiments of the present invention are not limited to structures for connecting device layer portions 111, 112. In some embodiments, circuit editing structures can also be used for disconnecting device layer portions 111, 112. As shown in FIG. 2A, a circuit editing structure, similar to the circuit editing structure in FIG. 1A can be formed from a plurality of metal layers 205. However, in this case, as formed, the resulting columns 201, 202 are electrically coupled, which electrically couples device layer portions 111 and 112. As shown in FIG. 2A, the columns 201, 202 are connected at least at the top layer 210 of the circuit editing structure 200. These features connecting two or more columns can also define circuit editing features. Thus, the circuit editing structure in FIG. 2A also provides an easily accessible point in an upper metal layer of the integrated circuit for disconnecting lower portions of the integrated circuit.

As previously described, the minimum column-to-interconnect spacing ($\beta$) between the circuit editing structure 200 and the interconnect structure 120 can be increased beyond the minimum design rule spacing for the interconnect layers 120 in order to account for the FIB milling process. For example, as shown in FIG. 2A, the minimum spacing ($\beta$) can be increased between the top layer 210 of the circuit editing structure 200 and the top layer 125 of the interconnect structure 120 ($\beta'>\beta$). As previously described, this spacing can be doubled ($\beta'=2\beta$). However, based on the FIB milling process being used, the spacing can be increased further or decreased, provided sufficient FIB process margin exists to prevent exposure of portions of the interconnect structure 120 during subsequent FIB processing.

Figure 2B:
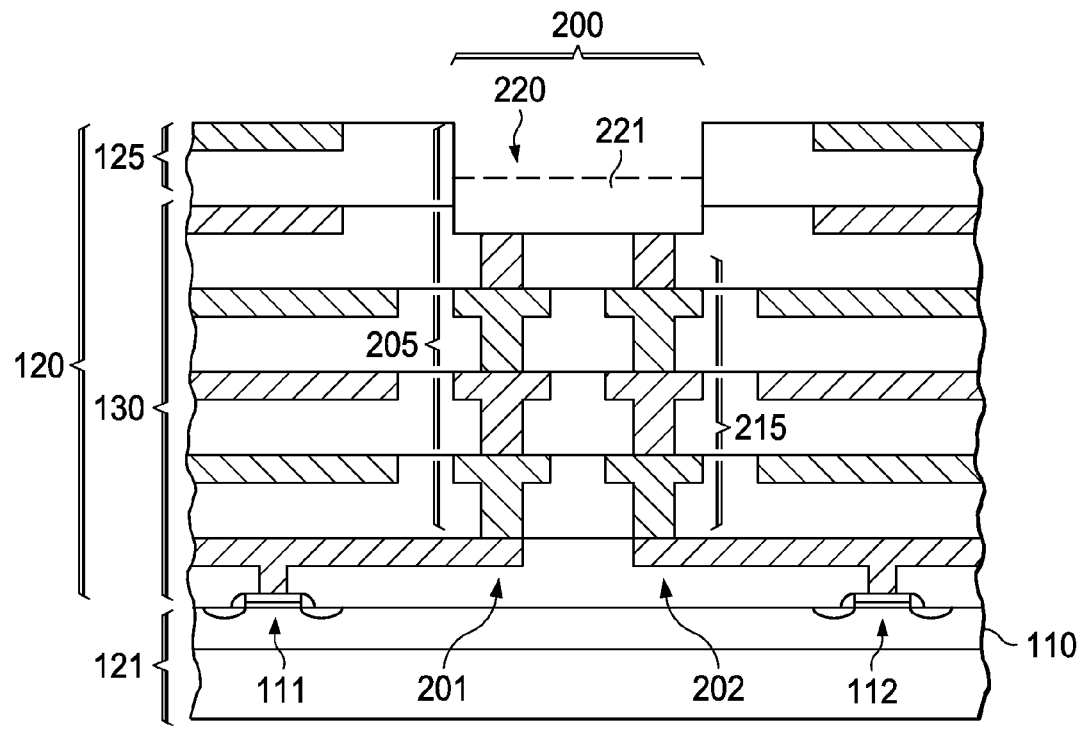
FIGS. 2B and 2C show exemplary processing of the circuit editing structure in FIG. 2A, according to an embodiment of the present invention.
Figure 2C:
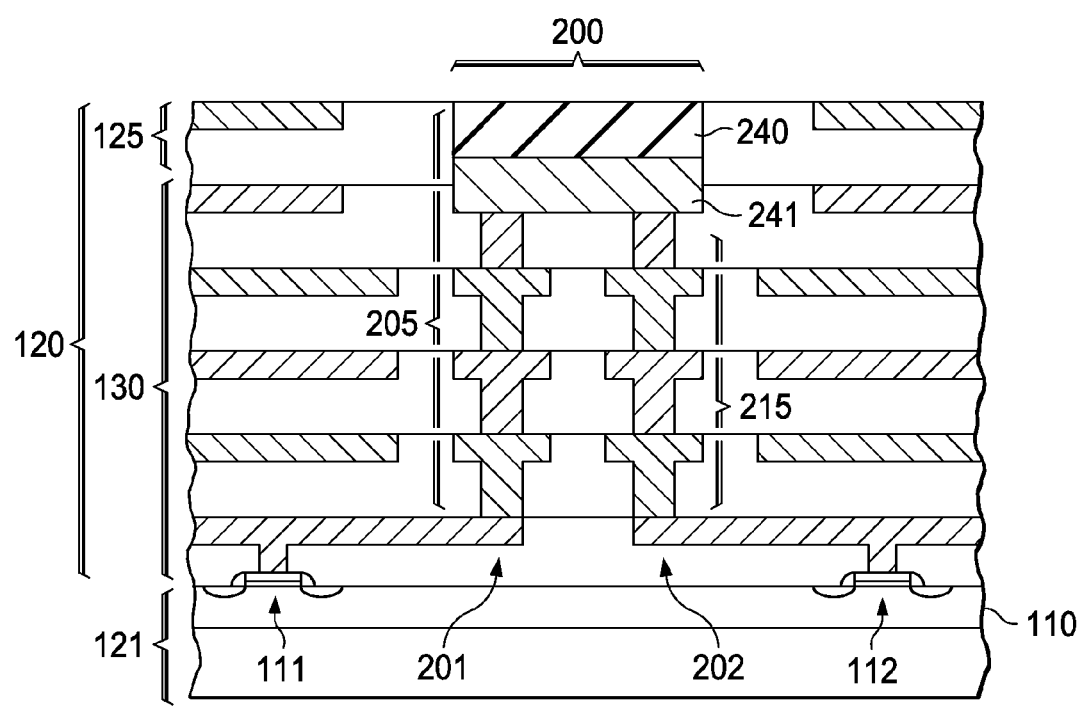

After the circuit editing structure in FIG. 2A is formed, subsequent testing of the integrated circuit may determine that the portions 111, 112 of the device layer associated with the circuit editing structure 200 need to be disconnected to debug or repair the integrated circuit. As previously described, the placement and formation of the circuit editing structure 200 provides a circuit editing structure that can be used to easily disconnect these portions of the integrated circuit in an upper metal layer, rather than having to perform FIB milling through multiple layers of the integrated circuit to reach device layer portions 111, 112. As shown in FIG. 2B, during a FIB circuit edit, FIB milling processes can be used to make a hole 220 by removing at least a portion the top layer 210 of the circuit editing structure 200 and at least a portion of the surrounding dielectric material. Afterwards, a FIB dielectric deposition process can be used to deposit a filler insulating material 240, as shown in FIG. 2C. Subsequently, the integrated circuit can be further tested to determine if additional FIB edits are needed.

Remaining portions of the columns 201, 202 can cause an increase in RC delay due to increased capacitance between the circuit editing structure 200 and the interconnect structure 120. In such cases, the FIB milling process can remove one or more other portions of the circuit editing structure 200. For example, as shown in FIG. 2B, both the top metal layer 210 and the next layer 211 can be removed. The resulting deeper hole 221 can, as previously described, be filled with a FIB deposited dielectric material 241. Afterwards, if no further device edits are required, then the mask for upper layers of the integrated circuit can be modified to reflect the changes in the integrated circuit made using FIB processing.

As described above, portions of the circuit editing structure 200 remaining after FIB processes can cause an RC delay in the surrounding interconnect structure 120 for certain integrated circuits. Similarly, the circuit editing structure 100 in FIG. 1A can also cause an RC delay. Therefore, in some embodiments, reduced capacitance circuit editing structures can be provided. In these embodiments, circuit editing structures are formed in only a portion of the plurality of metal layers in the integrated circuit to minimize or eliminate RC delays in the interconnect structure.

Figure 3A:
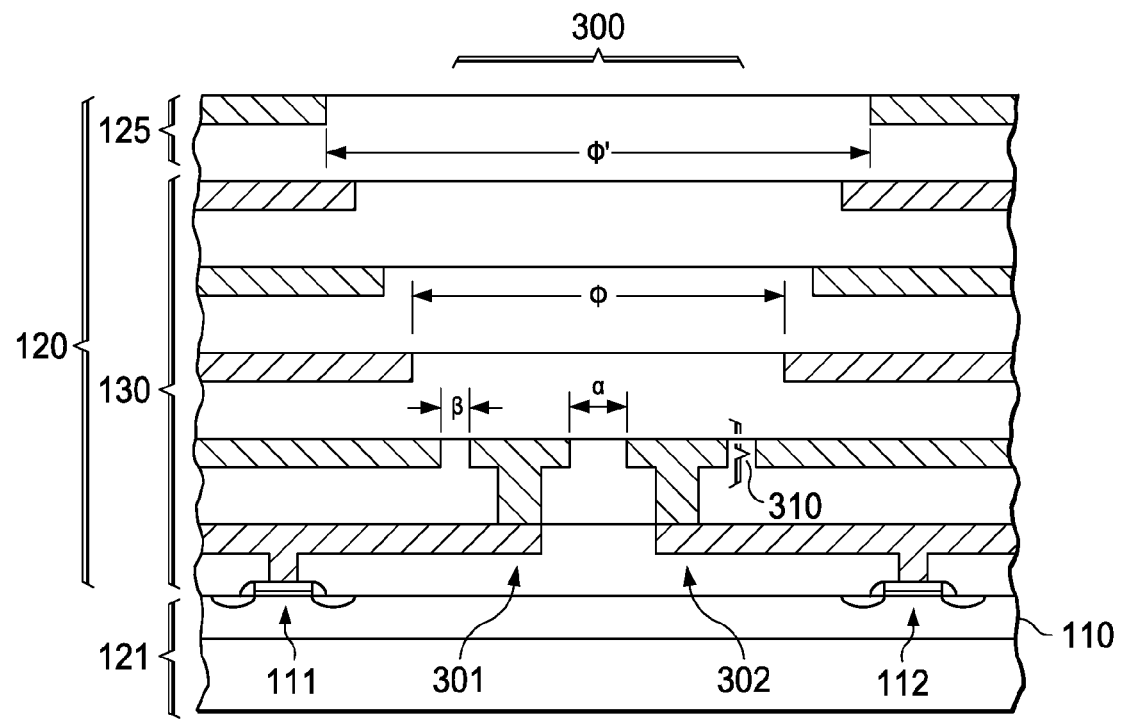
FIG. 3A shows an exemplary circuit editing structure according to an embodiment of the present invention.
Figure 4A:
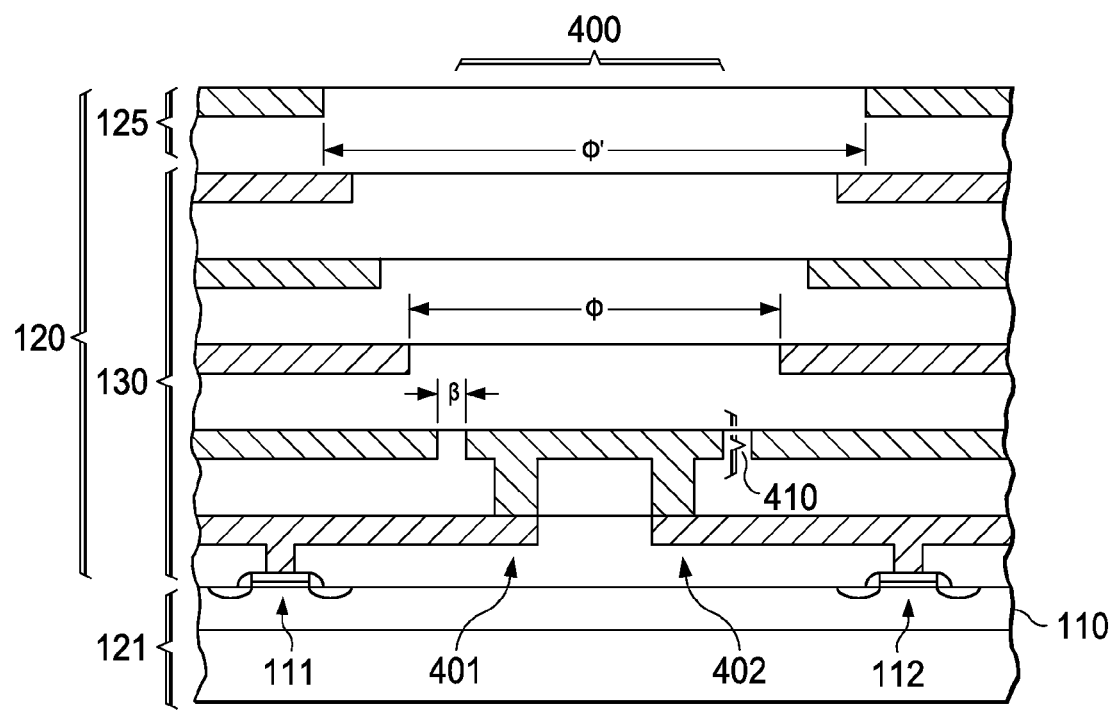
FIG. 4A shows an exemplary circuit editing structure according to an embodiment of the present invention.
Figure 4B:
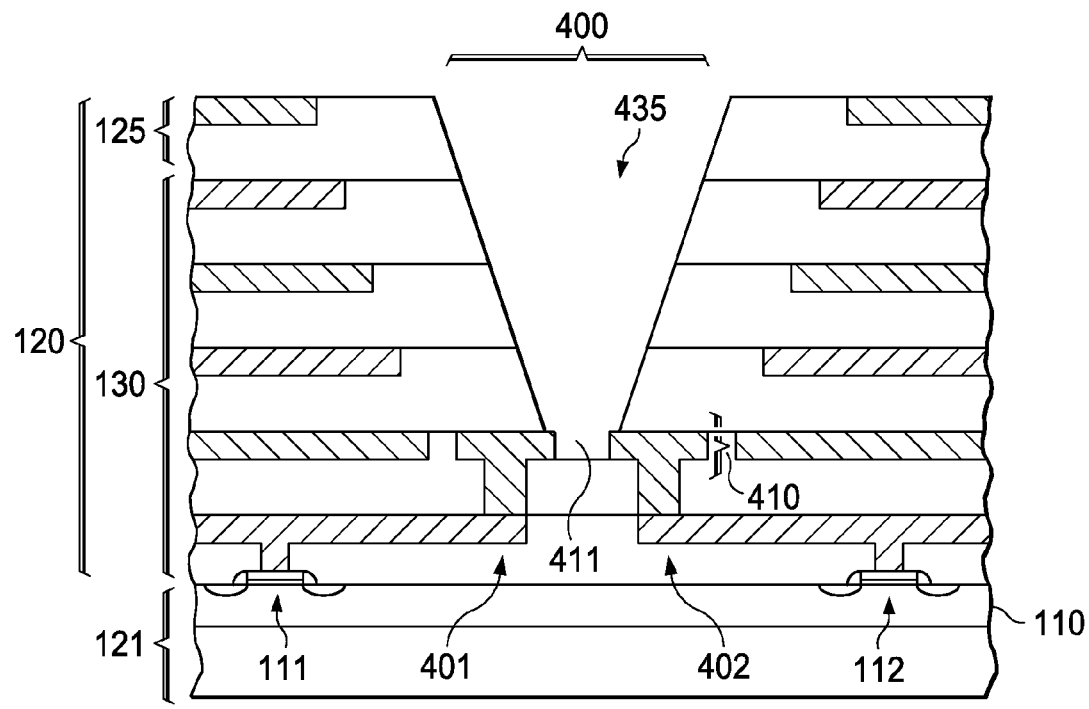
FIGS. 4B and 4C show exemplary processing of the circuit editing structure in FIG. 4A, according to an embodiment of the present invention.
Figure 4C:
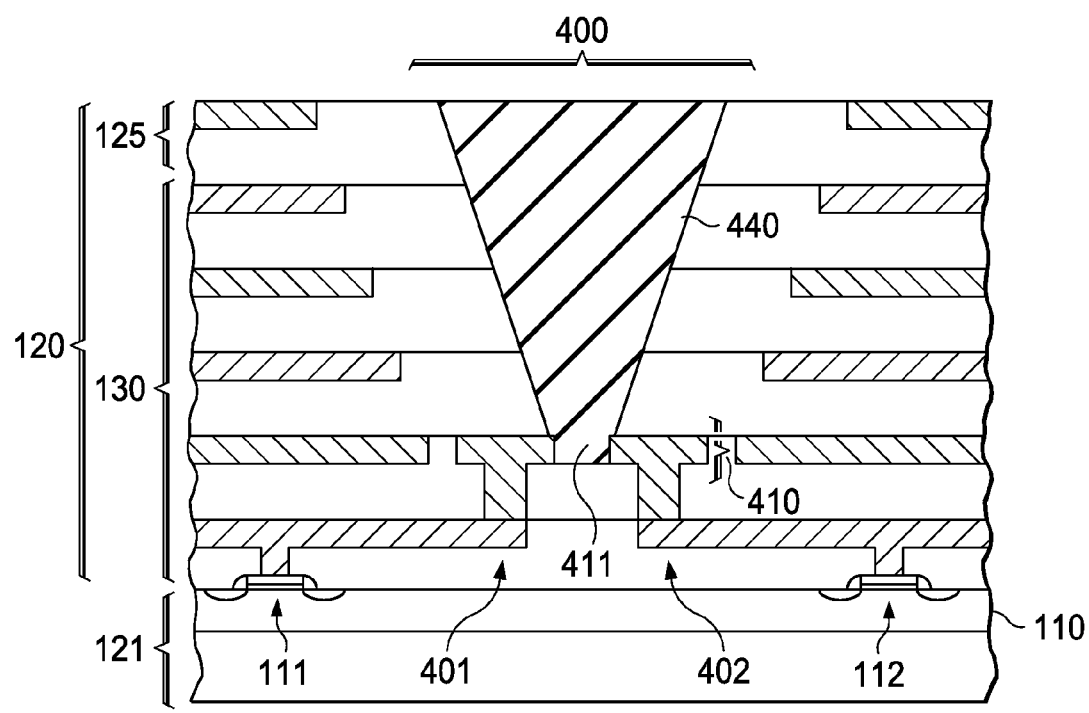

Reduced capacitance circuit editing structures, as shown in FIG. 3A and FIG. 4A, can be formed as previously described for FIG. 1A and FIG. 2A. To provide additional process margin during FIB processing, the design rules for metal layers in the interconnect structure and the circuit editing structures can be further modified.

Figure 3B:
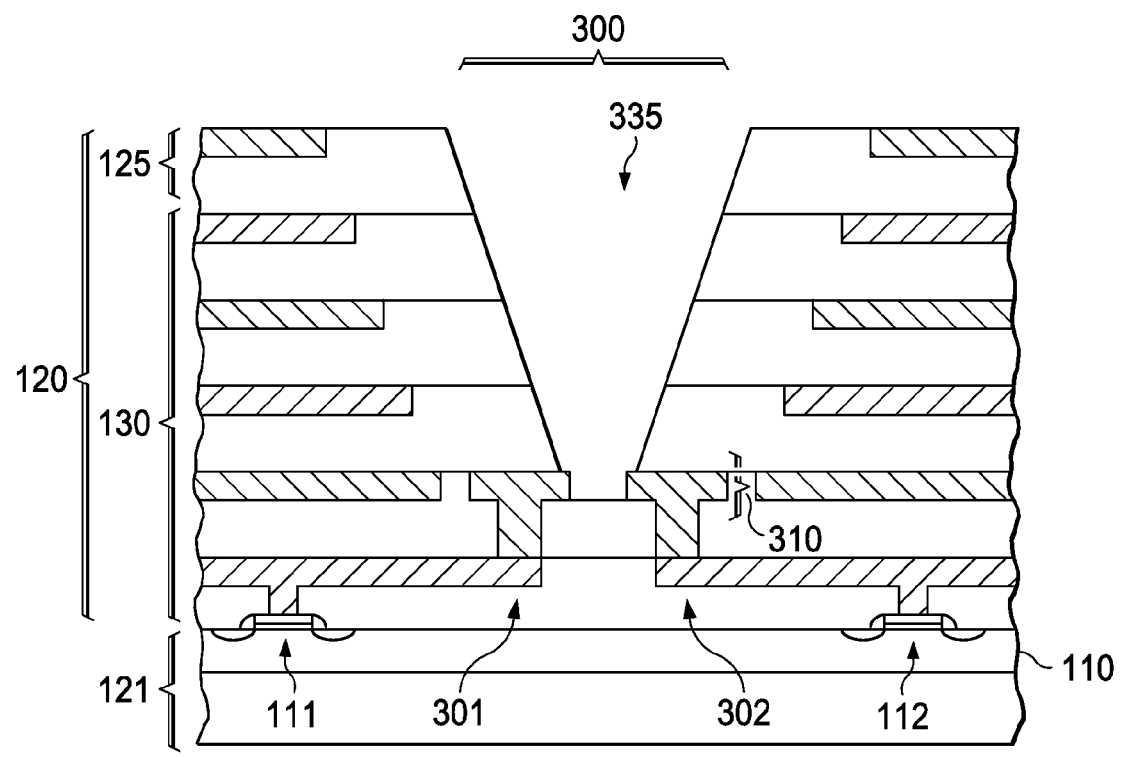
FIGS. 3B and 3C show exemplary processing of the circuit editing structure in FIG. 3A, according to an embodiment of the present invention.
Figure 3C:
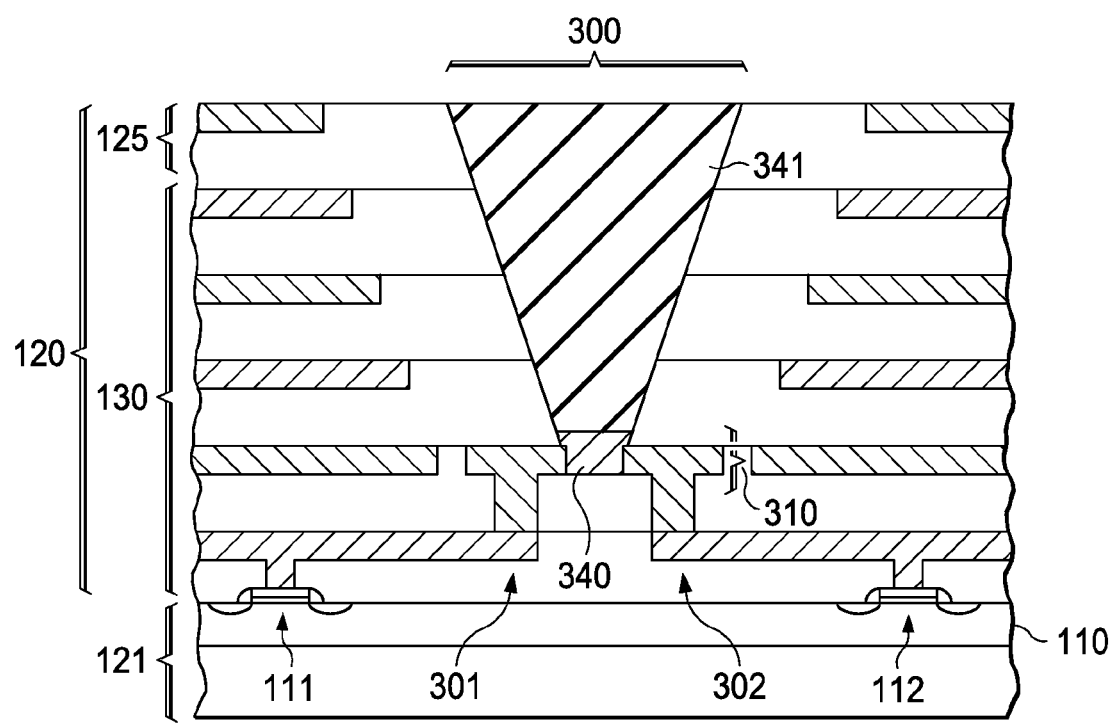

For example, as shown in FIG. 3A, a reduced capacitance FIB structure 300 having at least two columns 301, 302 for contacting two device layer portions 111, 112 can be provided. In FIG. 3A, the top layer 310 of the FIB structure 300 comprises at least two portions in FIB proximity and defines a circuit editing feature. Once the circuit editing structure 300 is formed, a FIB milling process can be used to remove dielectric material and form a hole 335 above and between portions of the top metal layer 310 of the circuit editing structure 300, as shown in FIG. 3B. Subsequently, a FIB strap 340, as shown in FIG. 3C, can be deposited to connect device layer portions 111, 112. Additionally, if a lower electrical resistance connection is needed, the hole 335 can be filled with additional metal 341, as shown in FIG. 3C. Although FIG. 3C shows a hole 335 completely filled with metal, one of ordinary skill in the art would recognize that a hole 335 can also be partially filled with a metal and the balance can comprise a dielectric material or a semiconducting material.

Because FIB milling processing results in a hole 335 that is typically wider at the top than at the bottom, as shown in FIG. 3B, the design rules for the integrated circuit can be accordingly adjusted to improve FIB process margin. In particular, a design rule for each level of the metal in the interconnect structure can specify that as the level of metal increases, the minimum FIB opening size or spacing ($\phi$) above the circuit editing feature of the circuit editing structure can also be increased. That is, for adjacent features in a metal layer (horizontally adjacent) and adjacent from a topdown view to the circuit editing features (vertically adjacent), a minimum FIB opening spacing ($\phi$) can be provided. For example, as shown in FIG. 3A, the minimum FIB opening spacing ($\phi$) for a metal layer can be a function of the normal minimum spacing for the layer, any minimum design rules associated with the circuit editing structure, and a "buffer" amount that accounts for the FIB milling process. A single design rule spacing can be used for all layers of the interconnect structure 120, provided the spacing is sufficient to prevent inadvertent exposure of the upper metal layers of the interconnect structure 120 during FIB milling processes. However, lower metal layers in the interconnect structure 120 can be placed closer to the circuit editing structure 300 ($\phi<\phi'$) for FIB milling processes that result in a tapered hole 335, as shown in FIG. 3B.

Similarly, a reduced capacitance circuit editing structure 400, as shown in FIG. 4A, can be formed having at least two columns 401, 402 contacting device layer portions 111, 112. Again, the layers of the interconnect structure 120 can be spaced from the circuit editing structure 400, as described above for FIG. 3A, resulting in a similar set of design rules for the minimum FIB opening spacings ($\phi$, $\phi'$). Consequently, a FIB milling process can be used to form a hole 435 and to remove at least a portion 411 of the top metal layer 410 of the circuit editing structure 400 defining the circuit editing feature. The hole 435, can then be filled with a FIB deposited dielectric material 440.

These reduced capacitance circuit editing structures 300, 400 still can be used to reduce the costs associated with mask redesign and production. Even if the FIB device edits are made in lower layers, because the circuit edits are generally limited to the metal layer mask levels, changes to these layers are still less costly and less problematic than changes to device layers for the integrated circuit. Even in cases where additional metal needs to be added to decrease electrical resistance, as shown in FIG. 3C, the costs associated with the number of mask levels that subsequently need to be redesigned and reproduced is still reduced, as higher interconnect level masks are generally easier and less costly to redesign and reproduce.

The various embodiments of the present invention are not limited to the circuit editing structures 100, 200, 300, and 400. Additional circuit editing structures can be formed to provide additional FIB editing capabilities necessary for some types of integrated circuits, such as non-volatile memory elements. A non-volatile memory element in a integrated circuit can generally have an initial endurance of a few thousand endurance cycles, each cycle including an erasure step (e.g., releasing electrons) and a programming step (e.g., trapping electrons). Thus, controlling the amount of electrons entering the floating gates in the non-volatile memory cells in each cycle can dramatically increase the endurance of the non-volatile memory. In general, the amount of electrons entering the floating gates can be regulated by varying the bitline and wordline voltages. These voltages can be adjusted using, for example, a tunable resistor.

Figure 5A:
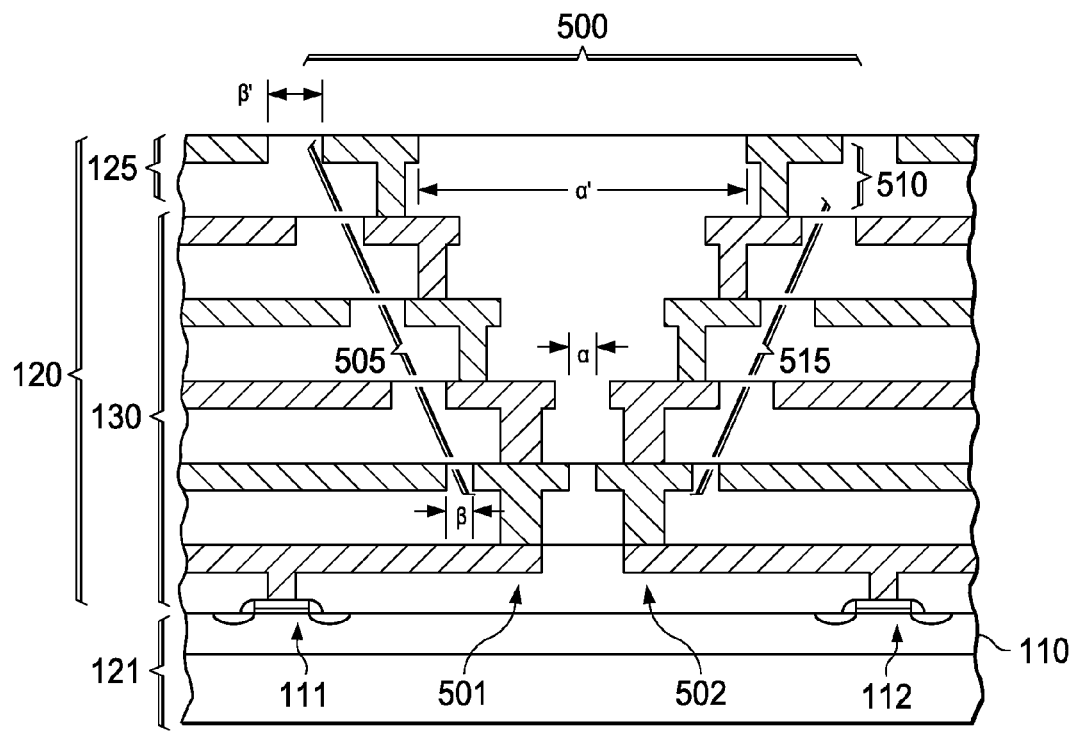
FIG. 5A shows an exemplary circuit editing structure according to an embodiment of the present invention.
Figure 5B:
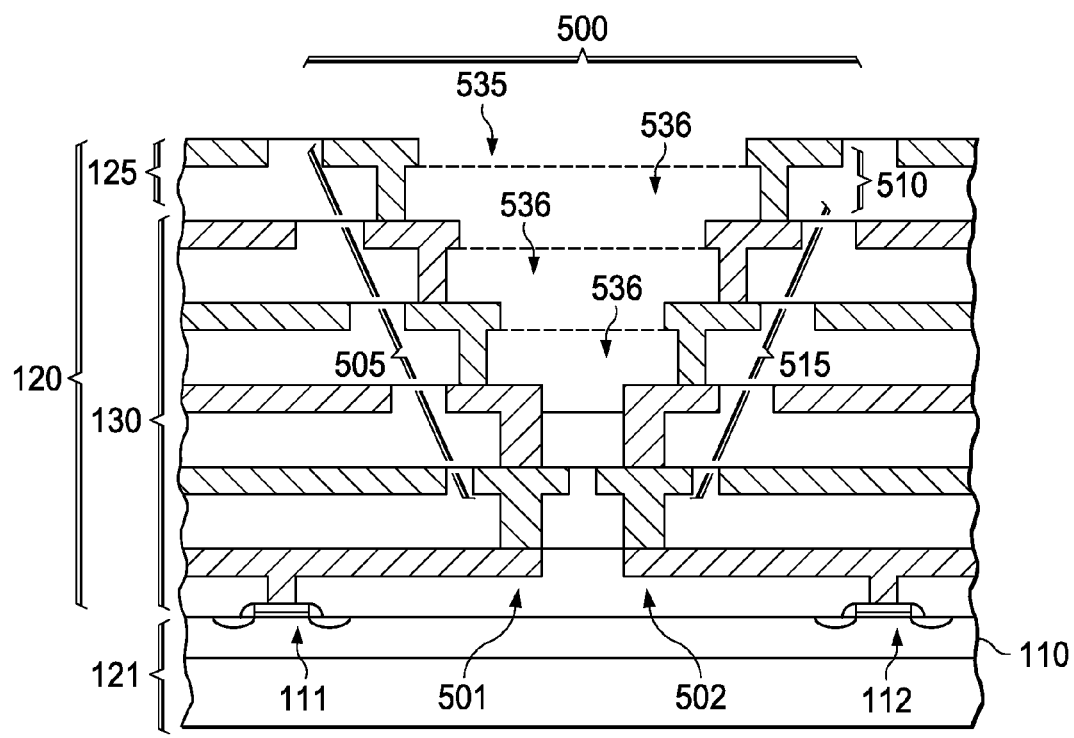
FIGS. 5B and 5C show exemplary processing of the circuit editing structure in FIG. 5A, according to an embodiment of the present invention.

According to one exemplary embodiment of the present invention, as illustrated in cross section view of the interconnect structure of an integrated circuit in FIG. 5A, an exemplary embodiment comprises a tunable resistor circuit editing structure 500 formed from a plurality of patterned electrically conductive metal layer layers 505 formed over the substrate 121. The plurality of layers 505 can form two electrically conductive columns 501, 502 connected to portions of the device layer 111, 112 on the integrated circuit.

The circuit editing structure in FIG. 5A can be designed and formed according to any of the methods previously described for circuit editing structures 100, 200, 300, or 400 However, in FIG. 5A, the minimum column-to-column spacing ($\alpha$) for the circuit editing structure 500 can be increased as the number of metal layers in the circuit editing structure 500 increases. For example, as shown in FIG. 5A, the minimum distance ($\alpha$) between each metal layer of the circuit editing structure is increasingly larger ($\alpha<\alpha'$). However, the invention is not limited in this regard and the spacing between portions of the columns 501, 502 of circuit editing structure 500 can be increased or decreased to allow a specified range of electrical resistances or at least a minimum electrical resistance. Moreover, the minimum spacing need not vary continuously.

As previously described for circuit editing structures 100 and 300, once circuit editing structure 500 is formed and subsequent testing indicates that a FIB strap and/or a specific resistance needs to be added to the circuit path, a FIB circuit edit can be performed. First, at least a portion of the dielectric material 535 between portions of the metal layers of the circuit editing structure 500 can be removed. Afterwards a FIB strap 540 can be deposited using a FIB metal deposition process. However, if the electrical resistance needs to be decreased, additional portions of the dielectric 536 between lower metal layers 515 of the circuit editing structure 500 can be removed, as previously described, and filled with additional metal strap portions 541 to lower electrical resistance between the device layer portions 111, 112. Consequently, the electrical resistance can be more accurately adjusted by providing varying minimum spacing (e.g., $\alpha<\alpha'$) between the various metal layers of the circuit editing structure 500 for which the resulting electrical resistance can be predicted. Subsequently, only the mask layers corresponding to the modified metal layers need to be redesigned and reproduced.

In yet another exemplary embodiment of the present invention, a circuit editing structure can be used or modified for accessing the circuit editing structure by etching through the substrate 121, as shown in FIGS. 6A-6C and FIGS. 7A-7C. Such embodiments can be particularly useful if it is necessary for the integrated circuit design that components in or on the interconnect circuit be placed such that the circuit editing structure is inaccessible through the interconnect structure.

Figure 6A:
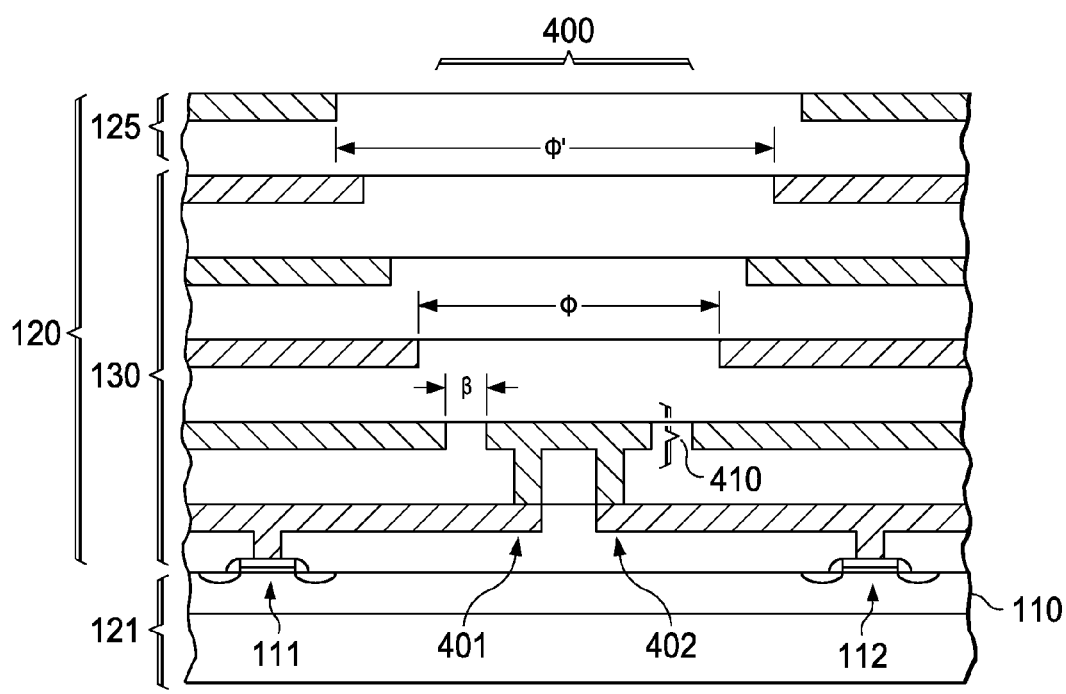
FIG. 6A shows an exemplary circuit editing structure according to an embodiment of the present invention.
Figure 6B:
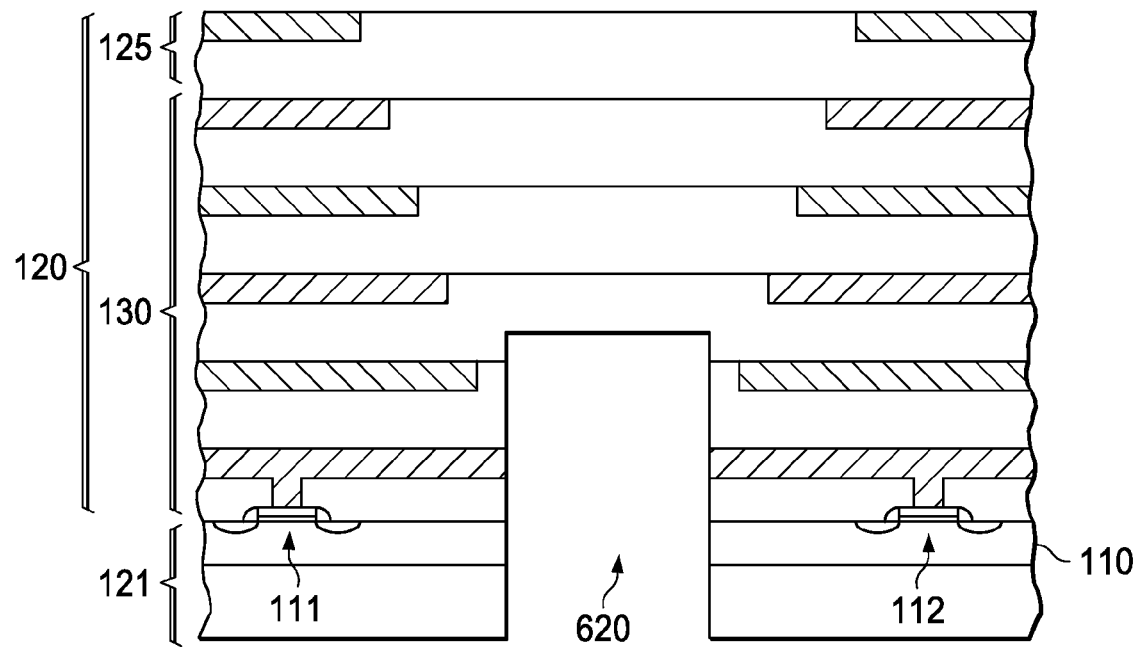
FIGS. 6B and 6C show exemplary processing of the circuit editing structure in FIG. 6A, according to an embodiment of the present invention.
Figure 6C:
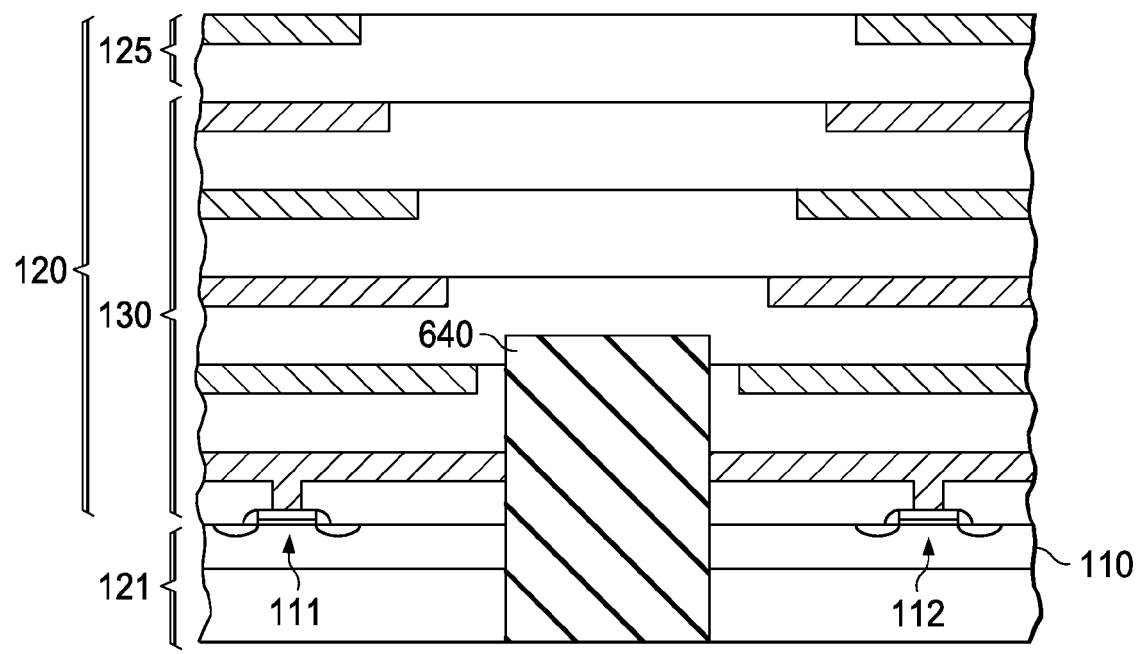

For example, FIG. 6A shows the same structure as described above in FIG. 4A. Although the circuit editing structure 400 could be accessed by etching through the interconnect structure, it is possible that under some circumstances, the area above circuit editing structure 400 is inaccessible. In such circumstances, FIB processing can be used to etch from the substrate side of the integrated circuit. As shown in FIG. 6B, during a device edit, FIB milling processes can be used to make a hole 620 by removing at least a portion of the device layer 110, the circuit editing structure 600 and at least a portion of the surrounding dielectric material. Afterwards, a FIB dielectric deposition process can be used to deposit a filler insulating material 640, as shown in FIG. 6C. Subsequently, the integrated circuit can be further tested to determine if additional FIB edits are needed, as previously discussed. Substrate-side FIB processing can also be used to provide a FIB strap to the circuit editing structure in FIG. 3A. Furthermore, circuit editing structures 100, 200, as shown in FIG. 1A and 2A can also be accessed and edited using a FIB processing that is performed through the substrate 121.

Figure 7A:
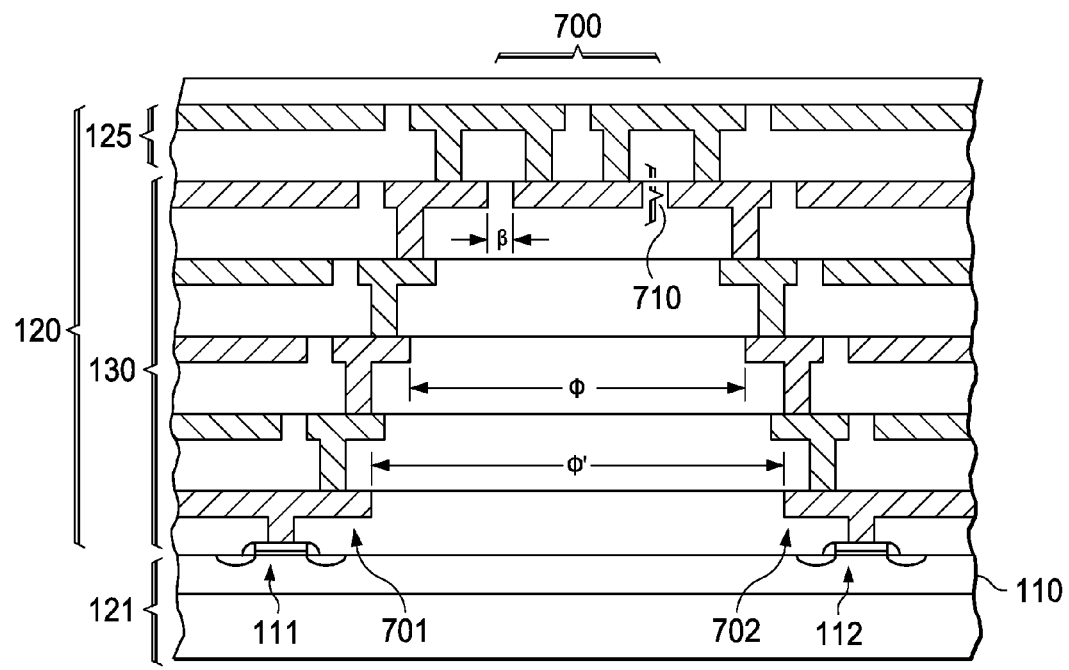
FIG. 7A shows an exemplary circuit editing structure according to an embodiment of the present invention.
Figure 7B:
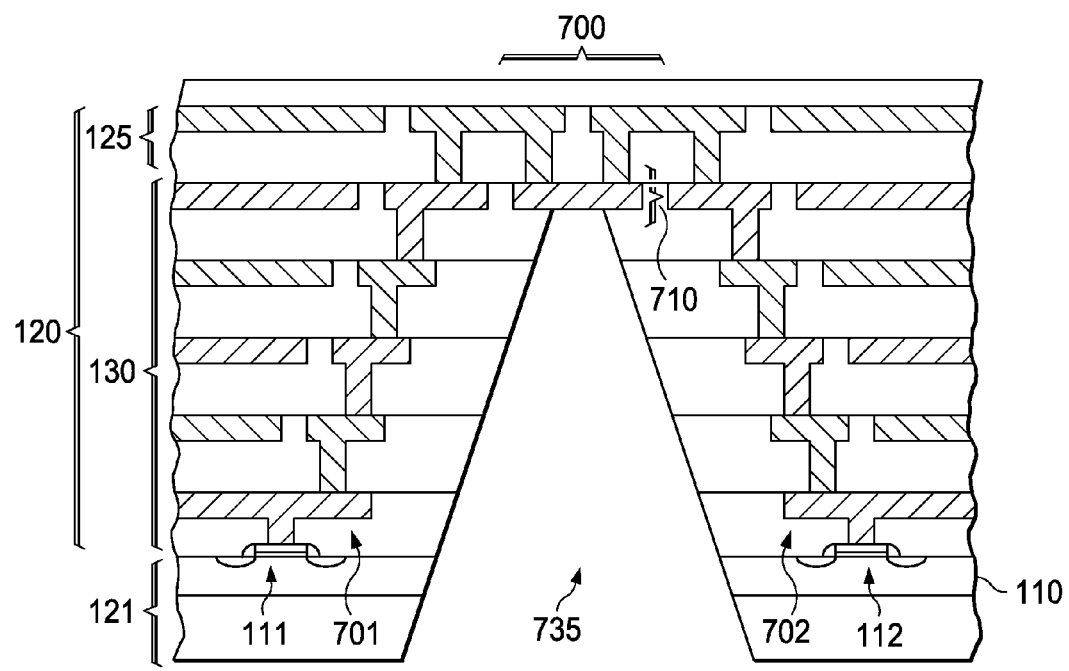
FIGS. 7B and 7C show exemplary processing of the circuit editing structure in FIG. 7A, according to an embodiment of the present invention.
Figure 7C:
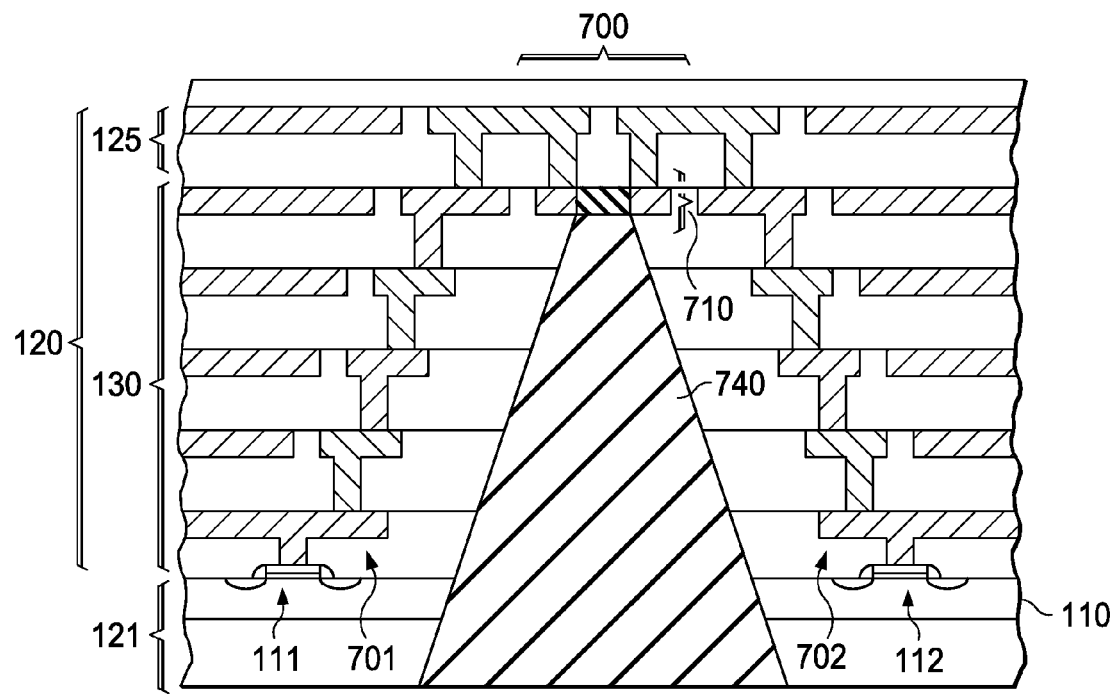

In some embodiments, the circuit editing structure can be modified to improve FIB process margin for FIB processing performed through the substrate. As shown in the exemplary embodiment in FIG. 7A, a circuit editing structure 700 with at least two columns 701, 702 that contact device layer portions 111, 112 can be provided to allow such access and yet still limit the number of mask levels that need to be re-spun. In the case of circuit editing structure 700, the circuit editing feature 710 is located in an upper metal layer. After a FIB milling process, the resulting hole 735 through the substrate 121 can be wider at the bottom than at the top, as shown in FIG. 7B. In order to provide adequate process margin for FIB processing, a design rule for each level of the metal in the interconnect structure or the columns can specify that as the level of metal decreases, the minimum FIB opening spacing ($\phi$) below circuit editing feature 710 can also be increased. For example, as shown in FIG. 7A, the minimum FIB opening size ($\phi$) for a metal layer can be a function of the normal minimum spacing for the layer, any minimum design rules associated with the circuit editing structure, and a "buffer" amount that accounts for the FIB milling process. Although a single design rule spacing can be used for all metal layers, the upper metal layers in the interconnect structure 120 and the columns 701, 701 can be placed closer to the circuit editing structure 300 ($\phi<\phi'$) for FIB milling processes that result in a tapered hole 735, as shown in FIG. 7B. After removing the FIB strap, the hole 735 can be filled with a FIB deposited dielectric 740. As previously discussed for other embodiments of the circuit editing structure, a circuit editing structure, similar the one illustrated in FIG. 7A can be provided with columns having portions in FIB proximity defining circuit editing features for connecting the columns or for adjusting electrical resistance between the columns. Furthermore, even though circuit editing feature 710 is shown in the upper layers of the interconnect structure 120, one of ordinary skill in the art will recognize that circuit editing feature 710 could be implemented in any level of the interconnect structure 120. Regardless of the process and the configuration of the circuit editing structure, by forming the circuit editing feature in the upper metal layers of the integrated circuit, the number of masks that may require redesign can be limited, reducing costs, cycle time, and scrap.

Figure 5C:
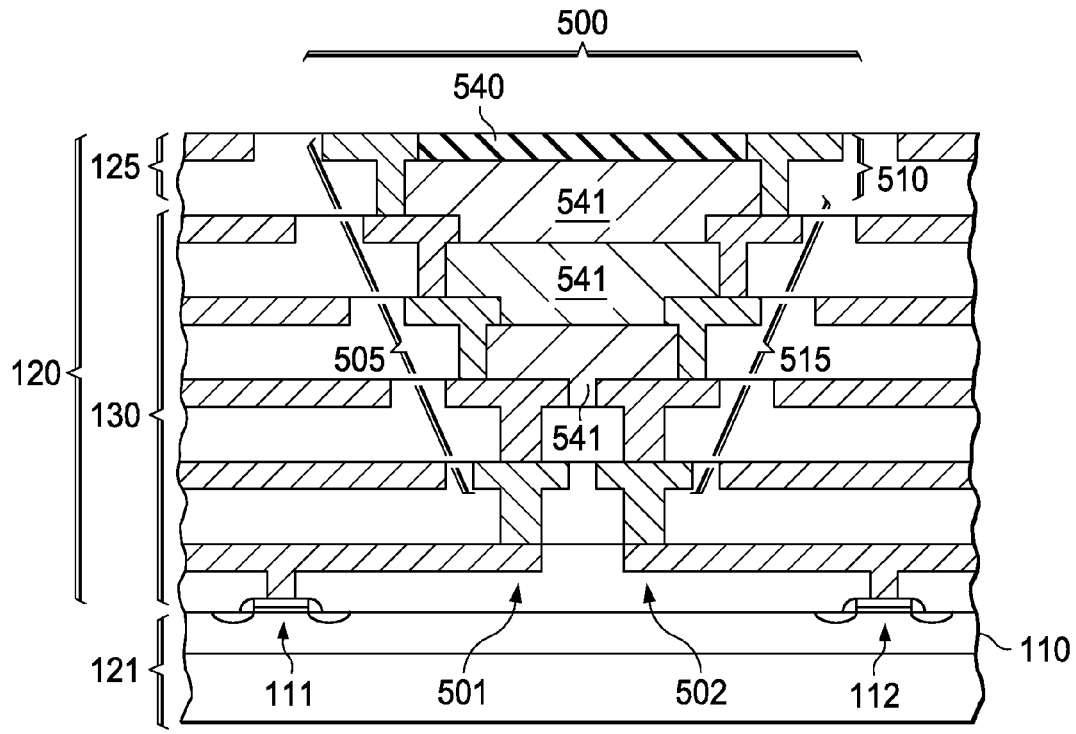

While this invention has been described according to some exemplary embodiments, it is of course contemplated that still other modifications of, and alternatives to, these embodiments, such modifications and alternatives obtaining the advantages and benefits of this invention, will be apparent to those of ordinary skill in the art having reference to this specification and its drawings. For example, multiple circuit editing structures can be placed in parallel or in series to provide more advanced FIB editing capabilities. In another example, a circuit editing structure, similar to the one shown in FIG. 5C, can be initially formed with portions of the FIB straps already including metal to be removed to increase electrical resistance or to disconnect circuit portions. In yet another example, the process flow can be such that the top metal layer is exposed at the end of the process flow. In such embodiments, a FIB strap can be added or etched with only minimal or no milling of the dielectric layers.

In still another example, the design rules for each layer of the interconnect structure and the FIB structure can be implemented in a design tool including automatic error checking circuit editing structures can be modeled electrically and can be included in a design toolkit for a circuit design tool, including circuit design tools distributed by Cadence, Synopsys, Mentor Graphics, Magma Design Automation, and others. The circuit editing structures can be modeled for inductance, resistance, capacitance and other electrical performance characteristics so that effects of including circuit editing structures in the integrated circuit design can be modeled to determine their impact on circuit performance. Thus, the circuit editing structures can be used no differently than a resistor, transistor, or capacitor during the design stage, allowing the circuit designer to run simulations and other figures of merit which account for the presence of the circuit editing structures.

Other modifications to the invention as described above are within the scope of the claimed invention. As an example, as noted above, the present invention can use dual damascene layers, as well as single damascene metal processes and non-damascene processes. Moreover, dual damascene layers can be fabricated using either a via-first (described above) or a trench-first process. Such processes can include full or partial via etch processes. In addition, it is within the scope of the invention to have interconnect structures with different thicknesses of metal layers or an interconnect structure layout configuration different than is shown in circuit editing structures 100, 200, 300, 400, 500, and 700.

Figure 8:
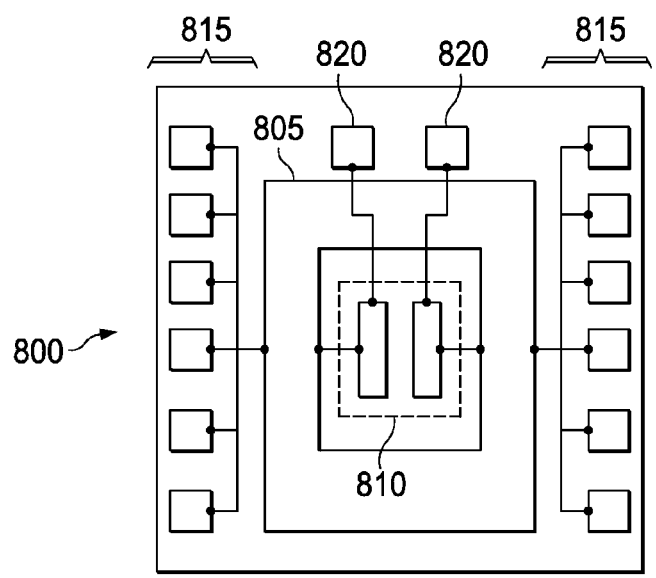
FIG. 8 shows an exemplary integrated circuit having a circuit editing structure according to an embodiment of the present invention.

In some embodiments, an integrated circuit can also include contacting structures, such as bond pads. In FIG. 8, an exemplary integrated circuit 800 with a region of interconnect structures 805 and one circuit editing structure 810 is shown. In integrated circuit 800, a plurality of bond pads 815 is provided to probe or contact the interconnect structure 805 and operate the device. In some embodiments, circuit editing structure can be included in an integrated circuit without contacting any type of bond pad. In other embodiments, such as in FIG. 8, the circuit editing structure 810 for connecting to lower layers of the integrated circuit 800 can be formed with connections to test bond pads 820 for performing at least some minimum electrical testing prior to FIB processing. For example, in the case where a FIB strap is to be deposited, the electrical testing can be used to determine how much resistance is needed. The information can then be used to determine the amount of FIB milling and FIB metal and dielectric to be deposited. Although the test bond pads 820 are shown in FIG. 8 to be placed along the edge of the integrated circuit 800, one or ordinary skill in the art will recognize that such an embodiment is only exemplary and that test bond pads 820 can be placed anywhere on the integrated circuit 800.

The design can be implemented in masks for contact, proximity, or projection photolithography processes. The masks can be designed to operate with any light source, including such as G-line, H-lines, the I-line resist processes. The masks can also be designed to be used with KrF and ArF laser resist processes. Furthermore, the masks can be designed to operate with DUV (deep ultraviolet), EUV (extreme ultraviolet), and X-ray resist processes.

The interconnect structure can contain other layers, such as a thin capping layer (e.g. TEOS) between the any dielectric layers and etch-stop or hardmask layers. Furthermore, although not shown above, dielectric layers can include a trench etch-stop layer therein as known in the art. Furthermore, the semiconductor substrate 121 can include various elements therein and/or layers thereon. These can include metal layers, barrier layers, dielectric layers, device structures, active elements and passive elements including word lines, source regions, drain regions, bit lines, bases, emitters, collectors, conductive lines, conductive vias, etc. Moreover, instead of using the invention on a CMOS structure as described above, the invention is applicable to other semiconductor technologies such as BiCMOS, bipolar, SOI, strained silicon, pyroelectric sensors, optoelectronic devices, microelectromechanicalical system (MEMS), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. An integrated circuit, comprising:
   a substrate having at least one device layer and a plurality of metal layers formed thereon, the metal layers comprising a patterned upper metal layer and multiple patterned lower metal layers;
   a multi-level metal interconnect structure formed using the metal layers, wherein a first portion of the interconnect structure is in electrical contact with a first portion of the device layer, and wherein a second portion of the interconnect structure is in electrical contact with a second portion of the device layer; and at least one multi-level circuit editing structure comprising a first column and a second column formed using the metal layers, wherein the first column is in electrical contact with the first portion of the device layer and the second column is in electrical contact with the second portion of the device layer;

wherein the first and second portions of the device layer are electrically coupled to one another if the first and second columns are electrically coupled to one another wherein the first and second portions of the device layer are electrically decoupled from one another if the first and second columns are electrically decoupled from one another, and wherein the circuit editing structure and the interconnect structure are dimensioned and configured in one of the following ways: at increasingly higher levels of the circuit editing structure and the interconnect structure, increasingly larger spacing exists between the circuit editing structure and the interconnect structure for preventing exposure of the interconnect structure in milling of the circuit editing structure through a level of the upper metal layer; and, at decreasingly lower levels of the circuit editing structure and the interconnect structure, increasingly larger spacing exists between the circuit editing structure and the interconnect structure for preventing exposure of the interconnect structure in milling of the circuit editing structure through the substrate.

2. The integrated circuit of claim 1, wherein the milling changes circuit interconnection of the device layer to at least one other operable circuit arrangement for the integrated circuit.

3. The integrated circuit of claim 1, further comprising a plurality of integrated circuit bond pad structures in electrical contact with the interconnect structure and electrically isolated from the columns.

4. The integrated circuit of claim 1, wherein the first column is separated from the second column by at least a minimum column to column spacing.

5. The integrated circuit of claim 1, wherein the interconnect structure is separated from the columns by at least a minimum column to interconnect spacing.

6. The integrated circuit of claim 1, wherein:
the milling includes focused ion beam processing; and
interconnect features of the interconnect structure are separated by at least a minimum focused ion beam opening spacing in the metal layers.

7. An integrated circuit, comprising:
a substrate having at least one a device layer and a plurality of metal layers formed thereon, the metal layers comprising a bottom metal layer formed above the device layer, multiple lower metal layers formed above the bottom metal layer, and an upper metal layer formed above the multiple lower metal layers; the bottom metal layer and the device layer each having isolated first and second portions, with contacts respectively connecting the first portion of the bottom metal layer to the first portion of the device layer and connecting the second portion of the bottom metal layer to the second portion of the device layer;

a multi-level metal interconnect structure formed using the metal layers;

at least one multi-level circuit editing structure comprising first and second columns of vias; the first column connecting a first portion of the upper metal layer to first portions of the multiple lower metal layers, and connecting the first portions of the multiple lower metal layers to the first portion of the bottom metal layer; and the second column connecting a second portion of the upper metal layer to portions of the multiple lower metal layers, and connecting the second portions of the multiple lower metal layers to the second portion of the bottom metal layer;

wherein the first and second portions of the device layer are electrically coupled to one another if the first and second columns are electrically coupled to one another wherein the first and second portions of the device layer are electrically decoupled from one another if the first and second columns are electrically decoupled from one another, and wherein the circuit editing structure and the interconnect structure are dimensioned and configured in one of the following ways: at increasingly higher levels of the circuit editing structure and the interconnect structure, increasingly larger spacing exists between the circuit editing structure and the interconnect structure for preventing exposure of the interconnect structure in milling of the circuit editing structure through a level of the upper metal layer; and, at decreasingly lower levels of the circuit editing structure and the interconnect structure, increasingly larger spacing exists between the circuit editing structure and the interconnect structure for preventing exposure of the interconnect structure in milling of the circuit editing structure through the substrate.

8. The circuit of claim 7, wherein the first and second columns are generally vertical.

9. The circuit of claim 7, wherein the circuit editing structure and the interconnect structure are dimensioned and configured so that, at increasingly higher levels of the circuit editing structure and the interconnect structure: increasingly larger spacing exists between the circuit editing structure and the interconnect structure for preventing exposure of the interconnect structure in milling of the circuit editing structure through a level of the upper metal layer; and increasingly larger spacing exists between the first and second columns.

10. The circuit of claim 7, wherein the milling includes focused ion beam processing, and wherein the circuit editing structure is dimensioned and configured for electrically decoupling the first and second columns from one another by milling of the circuit editing structure to disconnect the first and second portions of the upper metal layer from one another.

* * * * *